(12) United States Patent
Ding et al.

(10) Patent No.: US 12,527,172 B2
(45) Date of Patent: Jan. 13, 2026

(54) DISPLAY PANEL HAVING LIGHT-EMITTING DEVICES AND LIGHT DETECTION LAYER AND MANUFACTURING METHOD THEREFOR, AND DISPLAY APPARATUS

(71) Applicant: BOE TECHNOLOGY GROUP CO., LTD., Beijing (CN)

(72) Inventors: Xiaoliang Ding, Beijing (CN); Haisheng Wang, Beijing (CN); Yingming Liu, Beijing (CN); Yunke Qin, Beijing (CN); Yangbing Li, Beijing (CN); Lei Wang, Beijing (CN); Wenjuan Wang, Beijing (CN); Fangyuan Zhao, Beijing (CN); Ping Zhang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 757 days.

(21) Appl. No.: 17/628,829

(22) PCT Filed: Feb. 24, 2021

(86) PCT No.: PCT/CN2021/077723
§ 371 (c)(1),
(2) Date: Jan. 20, 2022

(87) PCT Pub. No.: WO2021/170006
PCT Pub. Date: Sep. 2, 2021

(65) Prior Publication Data
US 2022/0271104 A1    Aug. 25, 2022

(30) Foreign Application Priority Data
Feb. 24, 2020    (CN) .......................... 202010112467.0

(51) Int. Cl.
*H10K 59/13*    (2023.01)
*H10K 59/12*    (2023.01)
(Continued)

(52) U.S. Cl.
CPC ......... *H10K 59/13* (2023.02); *H10K 59/1213* (2023.02); *H10K 59/50* (2023.02);
(Continued)

(58) Field of Classification Search
CPC ...... H10K 59/60; H10K 59/131; H10K 59/50; H10K 59/1213; H10K 59/1201;
(Continued)

(56) References Cited

U.S. PATENT DOCUMENTS

2004/0031966 A1* 2/2004 Forrest ................... H10K 39/34
257/79
2004/0206960 A1* 10/2004 Nishikawa ......... H10K 59/8792
257/72

(Continued)

FOREIGN PATENT DOCUMENTS

CN    101047200 A    10/2007
CN    104914602 A    9/2015
(Continued)

OTHER PUBLICATIONS

Office Action for Chinese Patent Application No. 202010112467.0 issued by the Chinese Patent Office on Mar. 28, 2022.

*Primary Examiner* — Eric W Jones
(74) *Attorney, Agent, or Firm* — XSENSUS LLP (57) ABSTRACT

A display panel includes a display substrate. The display substrate includes: a base substrate; a display structure layer including a plurality of pixel circuits and a plurality of light-emitting devices on the base substrate; and a light detection layer located at a non-light exit side of the light-emitting devices. A pixel circuit in the plurality of pixel (Continued)

circuits is electrically connected to a respective light-emitting device to drive the light-emitting device to emit light. The light detection layer is configured to detect a luminous intensity of at least one light-emitting device. The display substrate further includes: a transparent cover plate at a light exit side of the light-emitting devices; and a polarizer and a first quarter-wave plate between the display substrate and the transparent cover plate. The polarizer is closer to the display substrate than the first quarter-wave plate.

17 Claims, 4 Drawing Sheets

(51) Int. Cl.
*H10K 59/121* (2023.01)
*H10K 59/131* (2023.01)
*H10K 59/50* (2023.01)
*H10K 59/60* (2023.01)
*H10K 59/80* (2023.01)

(52) U.S. Cl.
CPC ......... *H10K 59/60* (2023.02); *H10K 59/8791* (2023.02); *H10K 59/1201* (2023.02); *H10K 59/131* (2023.02)

(58) Field of Classification Search
CPC ...... H10K 71/00; H10K 50/868; H10K 59/13; H10K 59/8791
USPC .................................................... 257/40, 59
See application file for complete search history.

(56) References Cited

U.S. PATENT DOCUMENTS

| | | | | |
|---|---|---|---|---|
| 2004/0257355 | A1* | 12/2004 | Naugler | G09G 3/3291 345/204 |
| 2005/0248264 | A1 | 11/2005 | Cok | |
| 2006/0132401 | A1* | 6/2006 | Yamazaki | G09G 3/3275 257/E27.111 |
| 2006/0180890 | A1* | 8/2006 | Naugler | H10K 59/13 257/E27.111 |
| 2007/0236429 | A1 | 10/2007 | Tseng et al. | |
| 2008/0211399 | A1* | 9/2008 | Ryuji | H10K 59/38 313/506 |
| 2011/0221720 | A1* | 9/2011 | Kuo | H10K 59/13 345/82 |
| 2012/0105774 | A1* | 5/2012 | Fletcher | G02B 5/3016 349/98 |
| 2014/0175399 | A1* | 6/2014 | Choi | H10K 59/124 257/40 |
| 2014/0192277 | A1* | 7/2014 | Yilmaz | G06F 3/0446 349/12 |
| 2016/0077267 | A1* | 3/2016 | Inagaki | G02B 5/3033 359/489.07 |
| 2016/0155989 | A1* | 6/2016 | To | H10K 59/878 257/40 |
| 2016/0372709 | A1* | 12/2016 | Lee | H10K 59/877 |
| 2017/0178556 | A1 | 6/2017 | Wu | |
| 2017/0188463 | A1* | 6/2017 | Kim | H05K 1/028 |
| 2017/0372113 | A1* | 12/2017 | Zhang | H10K 59/12 |
| 2020/0050823 | A1* | 2/2020 | Jiang | G06F 21/32 |
| 2021/0193970 | A1 | 6/2021 | Hsieh | |
| 2021/0234059 | A1 | 7/2021 | Bu et al. | |

FOREIGN PATENT DOCUMENTS

| | | | |
|---|---|---|---|
| CN | 109801935 | A | 5/2019 |
| CN | 110208957 | A | 9/2019 |
| CN | 110265442 | A | 9/2019 |
| CN | 111312768 | A | 6/2020 |
| WO | 2019/080778 | A1 | 5/2019 |

* cited by examiner

DISPLAY PANEL HAVING LIGHT-EMITTING DEVICES AND LIGHT DETECTION LAYER AND MANUFACTURING METHOD THEREFOR, AND DISPLAY APPARATUS

CROSS-REFERENCE TO RELATED APPLICATIONS

This application is a national phase entry under 35 USC 371 of International Patent Application No. PCT/CN2021/077723 filed on Feb. 24, 2021, which claims priority to Chinese Patent Application No. 202010112467.0, filed on Feb. 24, 2020, which are incorporated herein by reference in their entirety.

TECHNICAL FIELD

The present disclosure relates to the field of display technologies, and in particular, to a display panel and a manufacturing method therefor, and a display apparatus.

BACKGROUND

Organic light-emitting diode (OLED) display panels have advantages such as self-luminescence, low power consumption, thinness, and high color saturation, and are widely used in various electronic devices including electronic products such as computers and mobile phones.

SUMMARY

In an aspect, a display panel is provided. The display panel includes a display substrate. The display substrate includes: a base substrate; a display structure layer, the display structure layer including a plurality of pixel circuits and a plurality of light-emitting devices that are sequentially stacked on the base substrate, and a pixel circuit in the plurality of pixel circuits being electrically connected to a respective light-emitting device to drive the light-emitting device to emit light; and a light detection layer located at a non-light exit side of the light-emitting devices, the light detection layer being configured to detect a luminous intensity of light-emitting device(s). The display panel further includes a transparent cover plate located at a light exit side of the light-emitting devices, the non-light exit side of the light-emitting devices being opposite to the light exit side of the light-emitting devices; and a polarizer and a first quarter-wave plate that are sequentially stacked between the display substrate and the transparent cover plate, the polarizer being closer to the display substrate than the first quarter-wave plate.

In some embodiments, an included angle between an optical axis of the first quarter-wave plate and a transmission axis of the polarizer is approximately 45 degrees.

In some embodiments, the display panel further includes a second quarter-wave plate disposed between the display substrate and the polarizer.

In some embodiments, an included angle between an optical axis of the second quarter-wave plate and a transmission axis of the polarizer is approximately 45 degrees.

In some embodiments, the light-emitting device includes a pixel electrode, a light-emitting layer and a common electrode. Common electrodes of the plurality of light-emitting devices are connected to constitute a common electrode layer. The light detection layer includes at least one photoelectric detector disposed in one-to-one correspondence with at least one light-emitting layer. Light transmittance of a portion of the common electrode layer corresponding to the at least one photoelectric detector is approximately 5%.

In some embodiments, the common electrode layer includes at least one light pass hole. The at least one light pass hole is in one-to-one correspondence with the at least one photoelectric detector, and an area of a light pass hole accounts for 4% to 6% of a surface area of a portion, corresponding to a photoelectric detector, of the common electrode layer.

In some embodiments, the common electrode layer is thinned to transmit light.

In some embodiments, the light-emitting device includes a pixel electrode, a light-emitting layer and a common electrode. The light detection layer includes at least one photoelectric detector disposed in one-to-one correspondence with at least one light-emitting layer. Pixel electrode(s) corresponding to the at least one photoelectric detector each have a light transmittance of approximately 5%.

In some embodiments, the pixel electrode(s) corresponding to the at least one photoelectric detector include light pass hole(s). An area of a light pass hole accounts for 4% to 6% of a surface area of a corresponding pixel electrode.

In some embodiments, the at least one pixel electrode is thinned to transmit light.

In some embodiments, each pixel circuit includes a plurality of thin film transistors. The thin film transistor is a metal oxide thin film transistor.

In some embodiments, the light detection layer includes at least one photoelectric detector. Each photoelectric detector includes a photosensitive device and a thin film transistor connected to the photosensitive device. The thin film transistor is an amorphous silicon thin film transistor.

In some embodiments, the photosensitive device includes a first electrode and a second electrode that are transparent, and a photoelectric conversion layer disposed between the first electrode and the second electrode. The photoelectric conversion layer is configured to convert absorbed light into electricity.

In some embodiments, the first electrode of the photosensitive device is connected to a common power line, the second electrode of the photosensitive device is connected to a source of the thin film transistor, a gate of the thin film transistor is connected to a gate line, and a drain of the thin film transistor is connected to a readout signal line.

In some embodiments, the display panel further includes an adhesive layer. The display structure layer and the light detection layer are connected through the adhesive layer.

In another aspect, a display apparatus is provided. The display apparatus includes the display panel as described in the above embodiments.

In yet another aspect, a manufacturing method for the display panel described in the above embodiments is provided. The manufacturing method includes: forming the display structure layer on a side of the base substrate, sequentially bonding the polarizer, the first quarter-wave plate and the transparent cover plate on a side of the base substrate facing away from the display structure layer through adhesive materials, and bonding the light detection layer on a side of the display structure layer facing away from the base substrate through another adhesive material.

In some embodiments, before sequentially bonding the polarizer, the first quarter-wave plate and the transparent cover plate on the side of the base substrate facing away from the display structure layer through the adhesive materials, the manufacturing method further includes: bonding a second quarter-wave plate on the side of the base substrate facing away from the display structure layer through another adhesive material.

In yet another aspect, a manufacturing method for the display panel described in the above embodiments is provided. The manufacturing method includes: sequentially forming the plurality of pixel circuits, the light detection layer, and the plurality of light-emitting devices on a side of the base substrate, the plurality of pixel circuits and the plurality of light-emitting devices constituting the display structure layer, and sequentially bonding the polarizer, the first quarter-wave plate and the transparent cover plate on a side of the plurality of light-emitting devices facing away from the base substrate through adhesive materials.

In some embodiments, before sequentially bonding the polarizer, the first quarter-wave plate and the transparent cover plate on the side of the plurality of light-emitting devices facing away from the base substrate through the adhesive materials, the manufacturing method includes: bonding a second quarter-wave plate on a side of the plurality of light-emitting devices facing away from the base substrate through another adhesive material.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Technical solutions in some embodiments of the present disclosure will be described clearly and completely below with reference to the accompanying drawings. However, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of", "the plurality of" or "multiple" means two or more unless otherwise specified.

In the description of some embodiments, the terms such as "coupled" and "connected" and derivatives thereof may be used. For example, the term "connected" may be used when describing some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "applicable to" or "configured to" used herein has an open and inclusive meaning, which does not exclude devices that are applicable to or configured to perform additional tasks or steps.

As used herein, the term "about" or "approximately" or "substantially" includes a stated value and an average value within an acceptable range of deviation of a particular value. The acceptable range of deviation is determined by a person of ordinary skill in the art in view of measurement in question and the error associated with the measurement of a particular quantity (i.e., the limitations of the measurement system).

Figure 1:
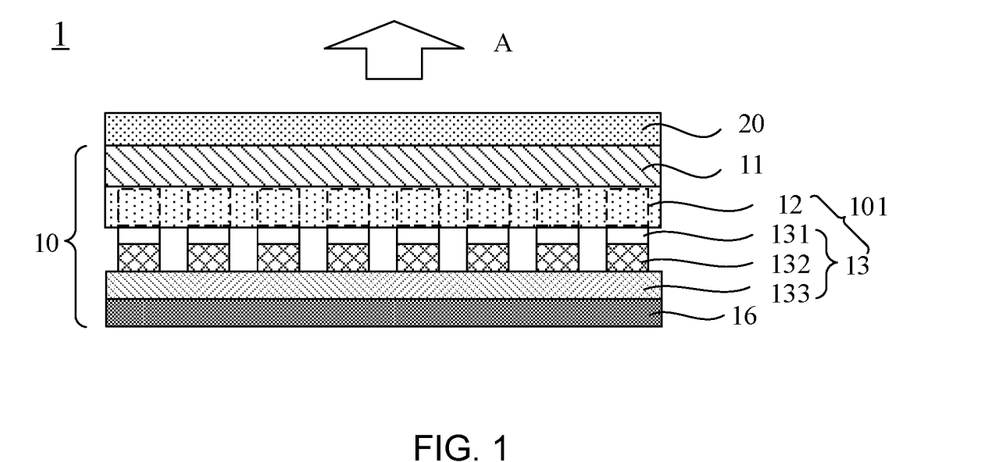
FIG. 1 is a schematic diagram showing a structure of a display panel, in accordance with some embodiments.

Some embodiments of the present disclosure provide a display panel 1. As shown in FIG. 1, the display panel 1 includes a display substrate 10, and a transparent cover plate 20 located at a light exit side of the display substrate 10.

In some embodiments, the transparent cover plate 20 is used to protect film layers included in the display substrate 10, such as a light-emitting layer 1321. Alternatively, the transparent cover plate 20 is used to protect a base substrate 11 of the display substrate 10.

The display panel 1 may be an organic light-emitting diode (OLED) display panel or a quantum dot light-emitting diode (QLED) display panel.

Figure 2:
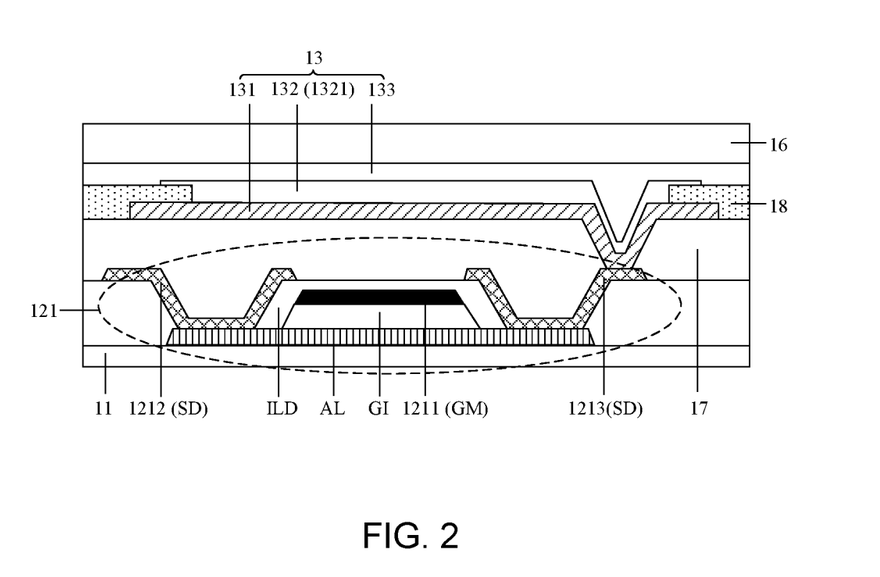
FIG. 2 is a schematic diagram showing a structure of a display substrate, in accordance with some embodiments.
Figure 3:
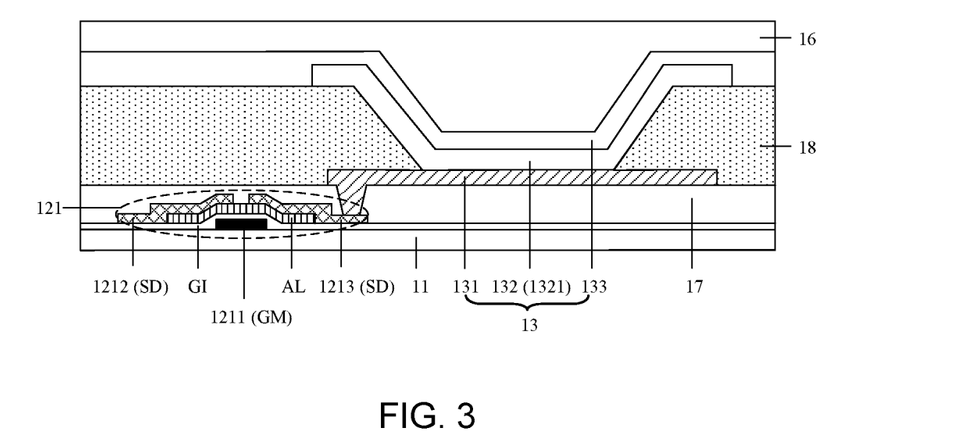
FIG. 3 is a schematic diagram showing a structure of another display substrate, in accordance with some embodiments.

As shown in FIGS. 1 to 3, the display substrate 10 includes the base substrate 11, and a plurality of pixel circuits 12 and a plurality of light-emitting devices 13 that are sequentially disposed on the base substrate 11.

It will be noted that, as shown in FIG. 1, the plurality of pixel circuits 12 and the plurality of light-emitting devices 13 may be referred to as a display structure layer 101.

The display substrate 10 further includes gate lines extending in a direction on the base substrate 11, and data lines and common power lines that are insulated from and intersected with the gate lines. The common power lines are generally parallel to the data lines. A plurality of sub-pixels may be defined with the gate lines and the data lines (and the common power lines) that are intersected. Each sub-pixel has a pixel circuit 12 and a light-emitting device 13. The pixel circuit 12 is electrically connected to the light-emitting device 13 to drive the light-emitting device 13 to emit light.

As shown in FIGS. 2 and 3, the pixel circuit 12 includes a plurality of thin film transistors 121 and at least one capacitor. Each thin film transistor 121 may be of a top-gate structure or a bottom-gate structure. As shown in FIG. 2, in a case where the thin film transistor 121 is of a top-gate structure, it includes an active layer AL, a gate insulating layer GI, a gate metal layer GM (which forms a gate 1211), an interlayer dielectric layer ILD, and a source-drain metal layer SD (which forms a source 1212 and a drain 1213) that are sequentially disposed on the base substrate 11. As shown in FIG. 3, in a case where the thin film transistor 121 is of a bottom-gate structure, it includes a gate metal layer GM (which forms a gate 1211), a gate insulating layer GI, an active layer AL and a source-drain metal layer SD (which forms a source 1212 and a drain 1213) that are sequentially disposed on the base substrate 11.

The active layer AL of the thin film transistor 121 may be made of amorphous silicon, single crystal silicon, polycrystalline silicon, or an oxide semiconductor. The active layer AL includes a channel region that is not doped with impurities, and a source region and a drain region that are respectively located at two sides of the channel region and formed by doping impurities. The doped impurities vary with the types of the thin film transistors, and the doped impurity may be an N-type impurity or a P-type impurity.

The capacitor (not shown in FIGS. 2 and 3) includes a first electrode plate and a second electrode plate. An interlayer insulating film as a dielectric is provided between the two electrode plates.

An electrical connection relationship between the inside and the outside of the pixel circuit will be described below by considering an example in which a pixel circuit includes two thin film transistors (i.e., a switching thin film transistor and a driving thin film transistor) and one capacitor (that is, the pixel circuit is of a 2T1C structure). Although FIGS. 2 and 3 only show the structures of the driving thin film transistor (the structure as shown in the dashed circle in FIGS. 2 and 3) and the light-emitting device 13 and a connection relationship therebetween, according to the description of the context, those skilled in the art may fully determine the structure of the switching thin film transistor and a connection relationship between the switching thin film transistor and other components.

A gate of the switching thin film transistor is connected to a gate line, a source of the switching thin film transistor is connected to a data line, and a drain of the switching thin film transistor is connected to a gate 1211 of the driving thin film transistor. The gate 1211 of the driving thin film transistor is connected to the drain of the switching thin film transistor, a source 1212 of the driving thin film transistor is connected to a common power line, and a drain 1213 of the driving thin film transistor is connected to a pixel electrode 131 of the light-emitting device 13 through a via hole. The first electrode plate of the capacitor is connected to the gate 1211 of the driving thin film transistor, and the second electrode plate of the capacitor is connected to the source 1212 of the driving thin film transistor.

The switching thin film transistor is turned on through a gate voltage applied to the gate line, and thus the switching thin film transistor transmits a data voltage applied to the data line to the driving thin film transistor. There is a certain difference between the data voltage transmitted from the switching thin film transistor to the driving thin film transistor and a common voltage applied from the common power line to the driving thin film transistor. A voltage corresponding to an absolute value of the difference is stored in the capacitor, and a current corresponding to the voltage stored in the capacitor flows into the light-emitting device 13 through the driving thin film transistor, so that the light-emitting device 13 emits light.

As shown in FIGS. 2 and 3, the light-emitting device 13 includes a pixel electrode 131, a light-emitting functional layer 132, and a common electrode 133 that are sequentially stacked. One of the pixel electrode 131 and the common electrode 133 is an anode (which is used for providing holes), and the other is a cathode (which is used for providing electrons). The pixel electrode 131 and the common electrode 133 respectively inject holes and electrons into the light-emitting functional layer 132. When excitons generated by the combination of the holes and the electrons transition from an excited state to a ground state, light is emitted.

The pixel electrode 131 may be formed of a metal with a high reflectivity, and the common electrode 133 may be formed of a transparent conductive film. In this case, the light emitted from the light-emitting functional layer 132 is reflected by the pixel electrode 131 and exits to the outside through the common electrode 123, thereby forming a top-emission light-emitting device. However, it is not limited thereto. In a case where the pixel electrode 131 is formed of a transparent conductive film and the common electrode 133 is formed of a metal with a high reflectivity, a bottom-emission light-emitting device may be formed. Of course, in a case where both the pixel electrode 131 and the common electrode 133 are formed of respective transparent conductive films, a double-sided emission light-emitting device may be formed.

The transparent conductive film may be made of, for example, indium tin oxide (ITO), indium zinc oxide (IZO), or indium gallium zinc oxide (IGZO). The metal with the high reflectivity may be, for example, Ag.

In some embodiments, the light-emitting functional layer 132 includes a light-emitting layer 1321. In some other embodiments, in addition to the light-emitting layer 1321, the light-emitting functional layer 132 further includes at least one of a hole injection layer (HIL), a hole transport layer (HTL), an electron transport layer (ETL), and an electron injection layer (EIL). In a case where all the layers are included, on the pixel electrode 131 that is served as the anode, the HIL, the HTL, the light-emitting layer 1321, the ETL, and the EIL are sequentially stacked.

As shown in FIGS. 2 and 3, the display substrate 10 further includes a planarization layer 17 disposed between the thin film transistors 121 and the pixel electrodes 131, and a pixel defining layer 18 disposed at a side of the pixel electrodes 131 away from the base substrate 11. The pixel defining layer 18 includes a plurality of opening regions, and barrier walls arranged around the opening regions. A light-emitting device 13 corresponds to an opening region. Pixel electrodes 131 of adjacent light-emitting devices 13 are separated by barrier walls of the pixel defining layer 18, and light-emitting layers 1321 of adjacent light-emitting devices 13 are separated by barrier walls of the pixel defining layer 18. The common electrodes 133 of the light-emitting devices 13 are connected to each other as a whole. That is, the common electrodes 133 form a whole layer, i.e., a common electrode layer.

In a case where the light-emitting device 13 includes at least one of the HIL, the HTL, the ETL, and the EIL, each of these film layers may be disconnected. That is, they are only disposed in the opening regions. Alternatively, these film layers may be each a whole layer.

In some embodiments, as shown in FIGS. 2 and 3, the display substrate 10 further includes an encapsulation layer 16 for encapsulating the plurality of light-emitting devices 13. In some embodiments, the encapsulation layer 16 may be an encapsulation film or an encapsulation substrate.

In a case where the encapsulation layer 16 is the encapsulation film, the number of layers of encapsulation sub-films included in the encapsulation layer 16 is not limited. In some embodiments, the encapsulation layer 16 may include one layer of encapsulation sub-film, or may include two or more layers of encapsulation sub-films that are stacked. For example, the encapsulation layer 16 includes three layers of encapsulation sub-films that are sequentially stacked.

In a case where the encapsulation layer 16 includes three layers of encapsulation sub-films that are sequentially stacked, an encapsulation sub-film located in the middle layer is made of an organic material, and encapsulation sub-films located at both sides of the encapsulation layer 16 are made of an inorganic material.

In some embodiments of the present disclosure, the organic material is not limited. The organic material may be, for example, polymethyl methacrylate (PMMA). Similarly, the inorganic material is not limited. For example, the inorganic material may be one or more of silicon nitride ($SiN_x$), silicon oxide ($SiO_x$), or silicon oxynitride ($SiO_xN_y$).

Due to the aging of the light-emitting layer, the display panel may have the problem of uneven brightness. Therefore, it is necessary to detect a luminous intensity of the display panel in real time, so as to compensate the luminous intensity thereof through internal compensation or external compensation, and thus make the brightness of all parts of images displayed by the display panel uniform.

Figure 4A:
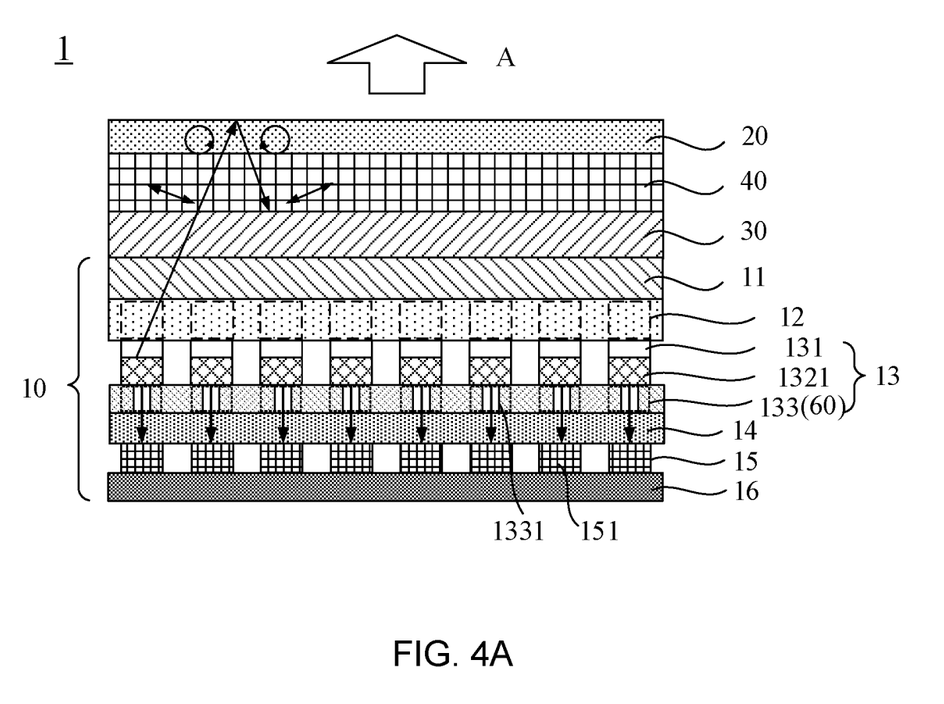
FIG. 4A is a schematic diagram showing a structure of another display panel, in accordance with some embodiments.

In some embodiments, as shown in FIG. 4A, the display panel 1 is a bottom-emission display panel, and a display direction thereof is a direction indicated by the arrow A. In order to achieve the real-time detection of the luminous intensity of the display panel 1, the display substrate 10 further includes a light detection layer 15 disposed at a side of the light-emitting devices 13 away from the base substrate 11. The light detection layer 15 is configured to detect the luminous intensity of light-emitting device(s) 13.

The light detection layer 15 includes at least one photoelectric detector 151 disposed in one-to-one correspondence with at least one light-emitting layer 1321. The at least one photoelectric detector 151 is configured to detect a luminous intensity of respective light-emitting layer(s) 1321.

In some embodiments, the light detection layer 15 includes one photoelectric detector 151. The photoelectric detector 151 corresponds to a light-emitting layer 1321 to detect a luminous intensity of the light-emitting layer 1321.

In some embodiments, the light detection layer 15 includes a plurality of photoelectric detectors 151. The plurality of photoelectric detectors 151 are in one-to-one correspondence with the plurality of light-emitting layers 1321 to detect luminous intensities of respective light-emitting layers 1321.

Figure 6:
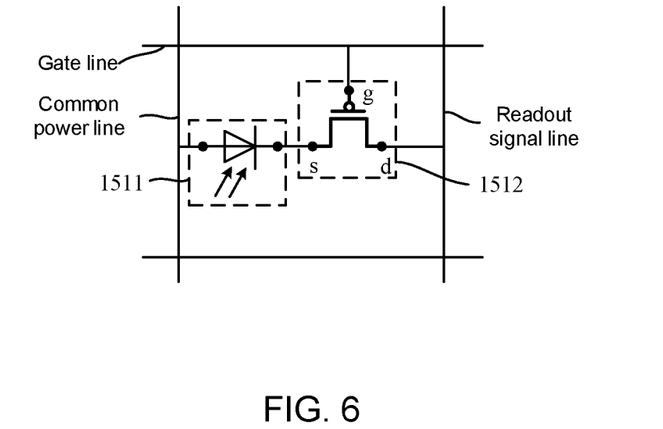
FIG. 6 is a schematic circuit diagram of a photosensitive device and a thin film transistor, in accordance with some embodiments.

In some embodiments, as shown in FIG. 6, the photoelectric detector 151 includes a photosensitive device 1511 and a thin film transistor 1512 connected to the photosensitive device 1511. The thin film transistor 1512 is, for example, an amorphous silicon thin film transistor. The photosensitive device 1511 is used for converting a detected optical signal into an electric signal. The amorphous silicon thin film transistor has balanced performance and a good response speed. By using the amorphous silicon thin film transistor, it is convenient to quickly read out the electric signal converted by the photosensitive device 1511.

Figure 7:
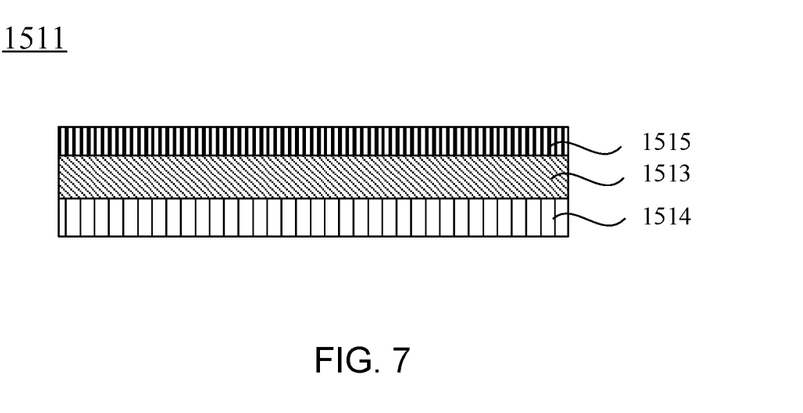
FIG. 7 is a schematic diagram showing a structure of a photosensitive device, in accordance with some embodiments.

In some embodiments, as shown in FIG. 7, the photosensitive device 1511 of the photoelectric detector 151 includes a first electrode 1515 and a second electrode 1514 that are transparent, and a photoelectric conversion layer 1513 disposed between the first electrode 1515 and the second electrode 1514. The photoelectric conversion layer 1513 is configured to convert absorbed light into electricity.

In some embodiments, the photoelectric conversion layer includes a P-type semiconductor layer, a semiconductor layer, and an N-type semiconductor layer that are stacked.

In some embodiments, as shown in FIG. 6, the first electrode of the photosensitive device 1511 is connected to a common power line, the second electrode of the photosensitive device 1511 is connected to a source of the thin film transistor 1512. A gate of the thin film transistor 1512 is connected to a gate line, and a drain of the thin film transistor 1512 is connected to a readout signal line.

The operating principle of the photoelectric detector 151 is that when the light emitted from the light-emitting layer 1321 irradiates the semiconductor layer, electrons in the semiconductor are released due to the acquisition of light energy, and electron-hole pairs, which are referred to as photogenerated carriers, are accordingly generated. Under an action of a reverse bias voltage, the electrons are driven to an N-type region, and the holes are driven to a P-type region, which makes a reverse current increase significantly. The greater the intensity of light, the greater the reverse current. The thin film transistor 1512 is turned on through a gate voltage applied to the gate line, and the electrical signal generated in the photosensitive device 1511 is output to a detection chip through the readout signal line.

In order to make the light emitted from light-emitting layer(s) 1321 pass through the common electrode layer and be incident on respective photoelectric detector(s) 151, and enable the photoelectric detector(s) 151 to detect the luminous intensity of the light-emitting layer(s) 1321, as shown in FIG. 4A, light transmittance of a portion of the common electrode layer 60 corresponding to the at least one photoelectric detector 151 is approximately 5%.

In some embodiments, as shown in FIG. 4A, the common electrode layer 60 includes at least one light pass hole 1331 in one-to-one correspondence with the at least one photoelectric detector 151. For example, there is one photoelectric detector 151. In this case, the common electrode layer 60 (a common electrode 133) includes a light pass hole 1331, and the light pass hole corresponds to the photoelectric detector 151. For example, there are a plurality of photoelectric detectors 151. In this case, the common electrode layer 60 includes a plurality of light pass holes 1331 in one-to-one correspondence with the plurality of photoelectric detectors 151. An area of a light pass hole 1331 accounts for 4% to 6% of a surface area of a portion, corresponding to a photoelectric detector 151, of the common electrode layer 60, so that the common electrode layer 60 may transmit light. Alternatively, the common electrode layer 60 is thinned to transmit light. In this way, the photoelectric detector(s) 151 receive light emitted by corresponding light-emitting layer(s) 1321 through light pass hole(s) or the thinned common electrode layer 60, so that the photoelectric detector(s) 151 can detect the light emitted from the corresponding light-emitting layer(s) 1321.

In some embodiments, as shown in FIG. 4A, the display substrate 10 further includes an adhesive layer 14. The plurality of light-emitting devices 13 and the light detection layer 15 are connected through the adhesive layer 14. A material of the adhesive layer 14 is an optically clear adhesive. In this way, the display structure layer (which includes the pixel circuits 12 and the light-emitting devices 13) and the light detection layer 15 may be separately fabricated. For example, the display structure layer is fabricated on a basis of the base substrate 11, and the light detection layer 15 is fabricated on a basis of the encapsulation layer 16. In some other embodiments, the display structure layer may be fabricated first on the basis of the base substrate 11 and then the light detection layer 15 is fabricated. For example, the display substrate 10 further includes an insulating layer disposed between the plurality of light-emitting devices 13 and the light detection layer, and the insulating layer is used to replace the adhesive layer 14. A material of the insulating layer is not limited, as long as it is transparent and enables the light emitted by the light-emitting device 13 to pass through and be incident on the light detection layer 15.

In some embodiments of the present disclosure, in a case where the display structure layer and the light detection layer 15 are separately fabricated, the encapsulation layer 16 is used as a carrier for the light detection layer 15, and the base substrate 11 is used as a carrier for the pixel circuits 12 and the light-emitting devices 13. In this way, a process of forming the pixel circuits 12 and the light-emitting devices 13 on the base substrate 11 and a process of forming the light detection layer 15 on the encapsulation layer 16 may be different, so that a design scheme of a pixel circuit 12 with a small leakage current may be adopted without considering a process of forming the light detection layer 15.

Figure 4B:
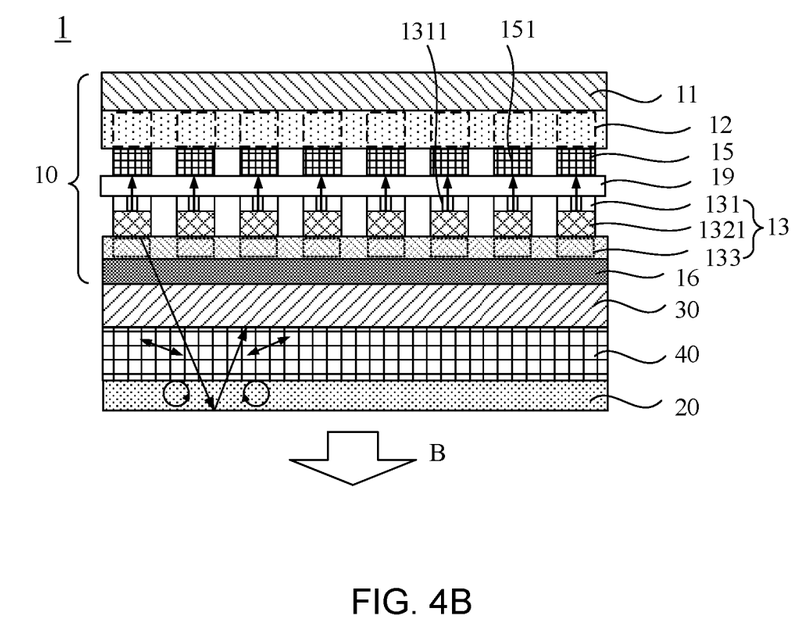
FIG. 4B is a schematic diagram showing a structure of yet another display panel, in accordance with some embodiments.

In some other embodiments, as shown in FIG. 4B, the display panel 1 is a top-emission display panel, and the display direction thereof is a direction indicated by the arrow B. In order to achieve the real-time detection of the luminous intensity of the display panel 1, the display substrate 10 further includes a light detection layer 15 disposed between the plurality of pixel circuits 12 and a plurality of pixel electrodes 131 of the plurality of light-emitting devices 13. The light detection layer 15 is configured to detect the luminous intensity of the light-emitting device(s) 13.

The light detection layer 15 is different from the light detection layer 15 in the above embodiment only in the arrangement position, and their structures are the same, which will not be repeated herein.

It is easy to understand that, in order to ensure that both the light detection layer 15 and the light-emitting device 13 can operate normally, the display substrate 10 further includes an insulating layer 19 disposed between the light detection layer 15 and the plurality of pixel electrodes 131. The material of the insulating layer 19 is not limited, as long as it is transparent and enables the light emitted by the light-emitting device 13 to pass through and be incident on the light detection layer 15.

Based on this, in order to make light emitted from light-emitting layer(s) 1321 pass through pixel electrode(s) 131 and be incident on respective photoelectric detector(s) 151, and enable the photoelectric detector(s) 151 to detect the luminous intensity of the light-emitting layer(s) 1321, the at least one pixel electrode 131 of the plurality of pixel electrodes 131 that corresponds to the at least one photoelectric detector 151 has a light transmittance of approximately 5%.

In some embodiments, there is one photoelectric detector 151. In this case, a light transmittance of a pixel electrode 131 that corresponds to the photoelectric detector 151 is approximately 5%. In some other embodiments, there are a plurality of photoelectric detectors 151. In this case, a plurality of pixel electrodes 131 that are in one-to-one correspondence with the plurality of photoelectric detectors 151 each have a light transmittance of approximately 5%.

In some embodiments, the pixel electrode 131 corresponding to the photoelectric detector 151 includes a light pass hole 1311. An area of a light pass hole 1311 accounts for 4% to 6% of a surface area of a corresponding pixel electrode 131, so that the pixel electrode 131 may transmit light. Alternatively, the pixel electrode 131 is thinned to transmit light. In this way, the photoelectric detector 151 receives the light emitted from the corresponding light-emitting layer 1321 through the light pass hole or the thinned pixel electrode 131, so that the photoelectric detector 151 can detect the light emitted from the corresponding light-emitting layer 1321.

When light enters an optically thinner medium (air) from an optically denser medium (glass), light whose incident angle is greater than a certain critical angle will be totally reflected. Therefore, when the light emitted from the light-emitting layer 1321 enters the external environment from the transparent cover plate 20, the incident angle of the light is approximately within a range of 0 degree to 70 degrees. A part of the light passes through the transparent cover plate 20 and enters the external environment, and the rest of the light (e.g., light with an incident angle greater than 40 degrees) will be totally reflected at an interface between the transparent cover plate 20 and the external environment. In a process that a current photoelectric detector 151 detects the luminous intensity of a corresponding current light-emitting layer 1321, a part of light emitted from a light-emitting layer 1321 adjacent to the current light-emitting layer 1321 may be totally reflected and incident on the current photoelectric detector 151, thereby causing crosstalk, which affects the detection of the luminous intensity of the current light-emitting layer 1321.

In view of this, as shown in FIGS. 4A and 4B, the display panel 1 provided by some embodiments of the present disclosure further includes a polarizer 30 and a first quarter-wave plate 40 that are sequentially stacked between the display substrate 10 and the transparent cover plate 20. The polarizer 30 cooperates with the first quarter-wave plate 40 to eliminate the light totally reflected at the transparent cover plate 20. For example, FIGS. 4A and 4B of some embodiments of the present disclosure only show the display panel 1, but an actual structure of the display panel 1 is not limited to the examples in FIGS. 4A and 4B.

Before introducing how to eliminate the light totally reflected at the transparent cover plate 20, the concept of an optical axis is explained below. When a beam of light is incident on a certain crystal, two beams of refracted light will be generated, and this phenomenon is referred to as birefringence. One of the two beams of refracted light obeys a usual law of refraction, and is referred to as ordinary light, which is abbreviated as o light; but the other beam of refracted light does not obey the law of refraction, and is referred to as extraordinary light, which is abbreviated as e light. When the crystal is rotated, a refraction direction of the ordinary light remains unchanged, while a refraction direction of the extraordinary light changes with a rotation direction. When the crystal is rotated to a certain direction, the refraction direction of the ordinary light coincides with the refraction direction of the extraordinary light, and this direction is referred to as the optical axis of the crystal. An optical axis of the first quarter-wave plate 40 may be understood with reference to the above.

The polarizer 30 only allows light whose polarization direction is parallel to a transmission axis of the polarizer 30 to pass through, and filters out light that vibrates perpendicular to the transmission axis. The transmission axis herein may also be referred to as a polarization axis.

An included angle between the optical axis of the first quarter-wave plate 40 and the transmission axis of the polarizer 30 is approximately 45 degrees. The first quarter-wave plate 40 may be referred to as a $\lambda/4$ wave plate.

Referring to FIGS. 4A and 4B, the light emitted from the light-emitting layer 1321 becomes first linearly polarized light after passing through the polarizer 30. The first linearly polarized light passes through the first quarter-wave plate 40 and then becomes left-handed (or right-handed) circularly polarized light (for convenience of description, the left-handed circularly polarized light is taken as an example herein for illustration). After the left-handed circularly polarized light is reflected at the interface between the transparent cover plate 20 and the external environment, a phase thereof changes by $\pi$, a polarization state thereof changes by $\lambda/2$, and the left-handed circularly polarized light is converted into right-handed circularly polarized light. After passing through the first quarter-wave plate 40, the right-handed circularly polarized light is converted into second linearly polarized light with an angle of minus 45 degrees to the optical axis of the first quarter-wave plate 40, and an included angle between the polarization directions of the second linearly polarized light and the first linearly polarized light is 90 degrees. The polarization direction of the first linearly polarized light is parallel to the transmission axis of the polarizer 30. That is, the polarization direction of the second linearly polarized light is perpendicular to the transmission axis of the polarizer 30. As a result, the second linearly polarized light cannot exit from the polarizer 30, and the light totally reflected at the interface between the transparent cover plate 20 and the external environment is eliminated and will not enter the light detection layer 15, which avoids crosstalk when the luminous intensity of the light-emitting layer 1321 is detected, so that the light detection layer 15 can detect the luminous intensity of the light-emitting layer 1321 more accurately.

There are many light-reflecting structures in the display panel 1, such as the gate lines, the data lines, the common power lines, and the gate metal layer and the source-drain metal layer of the thin film transistor 121 included in the pixel circuit 12, and the like. When ambient light enters the inside of the display panel 1 from the outside, part of the incident ambient light may be reflected by these light-reflecting structures, exits from the display panel 1 and enters the human eyes, which affects the display effect of the display panel 1.

Figure 5:
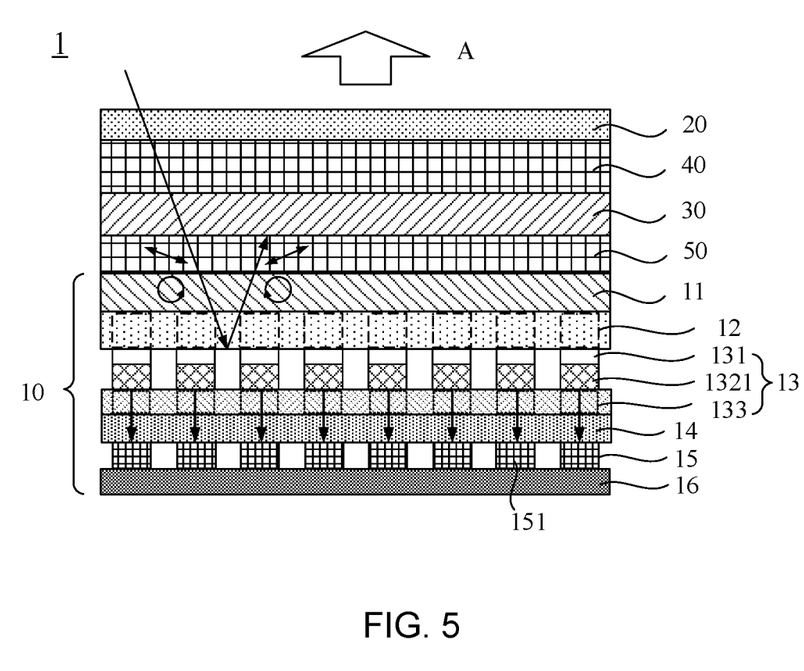
FIG. 5 is a schematic diagram showing a structure of yet another display panel, in accordance with some embodiments.

In some embodiments, as shown in FIG. 5, the display panel 1 further includes a second quarter-wave plate 50 disposed between the display substrate 10 and the polarizer 30. The second quarter-wave plate 50 may cooperate with the polarizer 30, so as to prevent the incident ambient light from being reflected to the outside by the light-reflecting structures in the display panel 1.

An optical axis of the second quarter-wave plate 50 may be understood with reference to the above, and will not be repeated herein.

An included angle between the optical axis of the second quarter-wave plate 50 and the transmission axis of the polarizer 30 is approximately 45 degrees. The second quarter-wave plate 50 may be referred to as a $\lambda/4$ wave plate.

The ambient light enters the display panel 1 and passes through the first quarter-wave plate 40, and the exit light is still natural light. Then the natural light passes through the polarizer 30 and becomes third linearly polarized light. After passing through the second quarter-wave plate 50, the third linearly polarized light becomes left-handed (or right-handed) circularly polarized light (for convenience of description, the left-handed circularly polarized light is taken as an example herein for illustration). After the left-handed circularly polarized light is reflected by a metal layer in the pixel circuit, a phase thereof changes by $\pi$, a polarization state thereof changes by $\lambda/2$, and the left-handed circularly polarized light is converted into right-handed circularly polarized light. After passing through the second quarter-wave plate 50, the right-handed circularly polarized light is converted into fourth linearly polarized light with an angle of minus 45 degrees to the optical axis of the second quarter-wave plate 40, and an included angle between the polarization directions of the fourth linearly polarized light and the third linearly polarized light is 90 degrees. The polarization direction of the third linearly polarized light is parallel to the transmission axis of the polarizer 30. That is, the polarization direction of the fourth linearly polarized light is perpendicular to the transmission axis of the polarizer 30. As a result, the fourth linearly polarized light cannot exit from the polarizer 30, thereby achieving the effect of eliminating the ambient light.

In addition, after the natural light passes through the quarter-wave plate, the exit light is still natural light. Therefore, the light (natural light) emitted from the light-emitting layer 1321 will not be affected after passing through the second quarter-wave plate 50. That is, the second quarter-wave plate 50 will not affect the processing of the light emitted from the light-emitting layer 1321 by the display panel 1.

FIG. 5 only illustrates an example where the second quarter-wave plate 50 is included in the bottom-emission display panel 1. It will be understood that the top-emission display panel 1 may also include a second quarter-wave plate 50, and the second quarter-wave plate 50 is also located between the display substrate 10 and the polarizer 30 in the top-emission display panel 1.

In the display panel 1 of some embodiments of the present disclosure, by arranging the first quarter-wave plate 40 and the polarizer 30 that are opposite to each other, it may be possible to eliminate the light that is emitted from the light-emitting layer 1321 and is totally reflected when entering the air, and prevent this part of the light from being totally reflected and entering the light detection layer 15, so that the detection of the light emitted from the light-emitting layer 1321 by the light detection layer 15 is not affected by the crosstalk of the reflected light inside the display panel. As a result, the light detection layer 15 may more accurately detect the luminous intensity of the light-emitting layer 1321 as a basis for brightness compensation. By arranging the second quarter-wave plate 50 and the polarizer 30 that are opposite to each other, it may be possible to eliminate the ambient light entering the display panel from the outside, so that the light emitted from the light-emitting layer 1321 is not affected by the crosstalk of the ambient light, which avoids affecting the display effect of the display panel.

Some embodiments of the present disclosure provide a display apparatus. The display apparatus includes the display panel 1, and has the same beneficial effects as those of the display panel 1, which will not be repeated herein.

Some embodiments of the present disclosure provide a manufacturing method for the display panel. For the bottom-emission display panel, when the display substrate is manufactured, a plurality of pixel circuits 12 and a plurality of light-emitting devices 13 are sequentially formed on a side of the base substrate 11, and the plurality of pixel circuits 12 and the plurality of light-emitting devices 13 are referred to as a display structure layer. The polarizer 30 and the first quarter-wave plate 40 are sequentially bonded on a side of the base substrate 11 away from the display structure layer through an adhesive material, and the transparent cover plate 20 is bonded on a side of the first quarter-wave plate 40 away from the base substrate 11 through an adhesive material. The light detection layer 15 is bonded on a side of the encapsulation layer 16 through an adhesive material, and the display structure layer and the light detection layer 15 are oppositely bonded through an adhesive material, so that each light-emitting device 13 in the display structure layer is opposite to a corresponding photoelectric detector 151 in the light detection layer 15. In this case, the adhesive material for bonding the display structure layer and the light detection layer 15 forms a bonding layer 14 between the display structure layer and the light detection layer 15, so that the display structure layer and the light detection layer 15 may be independently fabricated. Of course, the display structure layer may be fabricated first on the basis of the base substrate 11 and then the light detection layer 15 is fabricated. For example, an insulating layer, a light detection layer 15 and an encapsulation layer 16 are sequentially formed on a side of the plurality of light-emitting devices 13 facing away from the base substrate, and in this case, the bonding layer 14 is replaced by the insulating layer.

For the top-emission display panel, when the display substrate is manufactured, a plurality of pixel circuits 12, a light detection layer 15, a plurality of light-emitting devices 13, and an encapsulation layer 16 are sequentially formed on a side of the base substrate 11. A photoelectric detector 151 in the light detection layer 15 is positioned opposite to a corresponding light-emitting device 13. A polarizer 30 and a first quarter-wave plate 40 are sequentially bonded on a side of the encapsulation layer 16 facing away from the display structure layer through an adhesive material, and the transparent cover plate 20 is bonded on a side of the first quarter-wave plate 40 facing away from the base substrate 11 through an adhesive material.

In some embodiments, for a bottom-emission display panel, before the polarizer 30 and the first quarter-wave plate 40 are sequentially bonded on the side of the base substrate 11 facing away from the display structure layer through the adhesive material, a second quarter-wave plate 50 may also be bonded on the side of the base substrate 11 facing away from the display structure layer through an adhesive material. Moreover, the first quarter-wave plate 40, the polarizer 30 and the second quarter-wave plate 50 are bonded together through the adhesive materials. In some embodiments, the adhesive materials are each an optically clear adhesive.

In some embodiments, for a top-emission display panel, before the polarizer 30 and the first quarter-wave plate 40 are sequentially bonded on the side of the encapsulation layer 16 facing away from the display structure layer through the adhesive material, a second quarter-wave plate 50 may also be bonded on the side of the encapsulation layer 16 facing away from the display structure layer through an adhesive material. Moreover, the first quarter-wave plate 40, the polarizer 30 and the second quarter-wave plate 50 are bonded together through the adhesive materials. In some embodiments, the adhesive materials are each an optically clear adhesive.

The combination of the first quarter-wave plate 40 and the polarizer 30 may be referred to as an extinction device. Alternatively, the combination of the first quarter-wave plate 40, the polarizer 30, and the second quarter-wave plate 50 is referred to as an extinction device.

In some embodiments of the present disclosure, in a case where the display structure layer and the light detection layer 15 are separately fabricated, the encapsulation layer 16 is used as the carrier of the light detection layer 15, and the base substrate 11 is used as the carrier of the pixel circuits 12 and the light-emitting devices 13. The intensity of light emitted from the light-emitting layer 1321 is detected by the light detection layer 15. In this way, a process of forming the pixel circuits 12 and the light-emitting devices 13 on the base substrate 11 and a process of forming the light detection layer 15 on the encapsulation layer 16 may be different, so that the design scheme of a pixel circuit 12 with a small leakage current may be adopted without considering the process of forming the light detection layer 15.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:
1. A display panel, comprising:
a display substrate, including:
  a base substrate;
  a display structure layer, wherein the display structure layer includes a plurality of pixel circuits and a plurality of light-emitting devices that are sequentially stacked on the base substrate, and a pixel circuit in the plurality of pixel circuits is electrically connected to a respective light-emitting device to drive the light-emitting device to emit light;
  a light detection layer located at a non-light exit side of the plurality of light-emitting devices, and the light detection layer being configured to detect a luminous intensity of at least one light-emitting device; and
  a transparent adhesive layer;
a transparent cover plate located at a light exit side of the plurality of light-emitting devices, and the non-light exit side of the plurality of light-emitting devices being opposite to the light exit side of the plurality of light-emitting devices;

a polarizer and a first quarter-wave plate that are sequentially stacked between the display substrate and the transparent cover plate, and the polarizer being closer to the display substrate than the first quarter-wave plate;

a second quarter-wave plate disposed between the display substrate and the polarizer, wherein the light detection layer is disposed at a side of the plurality of light-emitting devices away from the plurality of pixel circuits;

the polarizer is disposed between the first quarter-wave plate and the second quarter-wave plate;

the display structure layer and the light detection layer are connected through the transparent adhesive layer; and each light-emitting device includes a pixel electrode, a light-emitting layer and a common electrode, common electrodes of the plurality of light-emitting devices are connected to constitute a common electrode layer, and the common electrode layer is in contact with the transparent adhesive layer.

2. The display panel according to claim 1, wherein an included angle between an optical axis of the first quarter-wave plate and a transmission axis of the polarizer is approximately 45 degrees.

3. The display panel according to claim 1, wherein
an included angle between an optical axis of the second quarter-wave plate and a transmission axis of the polarizer is approximately 45 degrees.

4. The display panel according to claim 1, wherein
the light detection layer includes at least one photoelectric detector disposed in one-to-one correspondence with at least one light-emitting layer; and light transmittance of a portion of the common electrode layer corresponding to the at least one photoelectric detector is approximately 5%.

5. The display panel according to claim 4, wherein the common electrode layer includes at least one light pass hole in one-to-one correspondence with the at least one photoelectric detector, and an area of a light pass hole accounts for 4% to 6% of a surface area of a portion, corresponding to a photoelectric detector, of the common electrode layer; or wherein the common electrode layer is thinned to transmit light.

6. A manufacturing method for the display panel according to claim 4, the method comprising:
forming the display structure layer on a side of the base substrate;
sequentially bonding the polarizer, the first quarter-wave plate and the transparent cover plate on a side of the base substrate facing away from the display structure layer through adhesive materials; and
bonding the light detection layer on a side of the display structure layer facing away from the base substrate through another adhesive material, wherein
forming the display structure layer on the side of the base substrate, includes:
sequentially forming the plurality of pixel circuits and the plurality of light-emitting devices on the side of the base substrate, the plurality of pixel circuits and the plurality of light-emitting devices constituting the display structure layer, and each light-emitting device includes the pixel electrode, the light-emitting layer and the common electrode, the common electrodes of the plurality of light-emitting devices are connected to constitute the common electrode layer;

bonding the light detection layer on the side of the display structure layer facing away from the base substrate, includes:
bonding the light detection layer on the side of the plurality of light-emitting devices facing away from the plurality of pixel circuits; and the method further comprising:
forming the transparent adhesive layer between the display structure layer and the light detection layer, wherein the display structure layer and the light detection layer are connected through the transparent adhesive layer, and the common electrode layer is in contact with the transparent adhesive layer;

wherein before sequentially bonding the polarizer, the first quarter-wave plate and the transparent cover plate on the side of the base substrate facing away from the display structure layer through the adhesive materials, the method further comprises:
bonding the second quarter-wave plate on the side of the base substrate facing away from the display structure layer through yet another adhesive material.

7. The display panel according to claim 1, wherein each pixel circuit includes a plurality of thin film transistors, and each of the thin film transistors is a metal oxide thin film transistor.

8. The display panel according to claim 1, wherein the light detection layer includes at least one photoelectric detector, each photoelectric detector includes a photosensitive device and a thin film transistor connected to the photosensitive device, and the thin film transistor is an amorphous silicon thin film transistor;

wherein the photosensitive device includes a first electrode and a second electrode that are transparent, and a photoelectric conversion layer disposed between the first electrode and the second electrode, and the photoelectric conversion layer is configured to convert absorbed light into electricity; and the first electrode of the photosensitive device is connected to a common power line, the second electrode of the photosensitive device is connected to a source of the thin film transistor, a gate of the thin film transistor is connected to a gate line, and a drain of the thin film transistor is connected to a readout signal line.

9. A display apparatus, comprising the display panel according to claim 1.

10. A display panel, comprising:
a display substrate, including:
a base substrate;
a display structure layer, wherein the display structure layer includes a plurality of pixel circuits and a plurality of light-emitting devices that are sequentially stacked on the base substrate, and a pixel circuit in the plurality of pixel circuits is electrically connected to a respective light-emitting device to drive the light-emitting device to emit light;
a light detection layer located at a non-light exit side of the plurality of light-emitting devices, and the light detection layer being configured to detect a luminous intensity of at least one light-emitting device; and
a transparent insulating layer;
a transparent cover plate located at a light exit side of the plurality of light-emitting devices, and the non-light exit side of the plurality of light-emitting devices being opposite to the light exit side of the plurality of light-emitting devices;
a polarizer and a first quarter-wave plate that are sequentially stacked between the display substrate and the transparent cover plate, and the polarizer being closer to the display substrate than the first quarter-wave plate; and a second quarter-wave plate disposed between the display substrate and the polarizer, wherein the light detection layer is disposed between the plurality of pixel circuits and the plurality of light-emitting devices;

the polarizer is disposed between the first quarter-wave plate and the second quarter-wave plate; and the transparent insulating layer is disposed between the plurality of light-emitting devices and the light detection layer.

11. The display panel according to claim 10, wherein each light-emitting device includes a pixel electrode, a light-emitting layer and a common electrode;

the light detection layer includes at least one photoelectric detector disposed in one-to-one correspondence with at least one light-emitting layer; and at least one pixel electrode corresponding to the at least one photoelectric detector has a light transmittance of approximately 5%.

12. The display panel according to claim 11, wherein the at least one pixel electrode corresponding to the at least one photoelectric detector includes at least one light pass hole, and an area of a light pass hole accounts for 4% to 6% of a surface area of a corresponding pixel electrode; or wherein the at least one pixel electrode is thinned to transmit light.

13. A manufacturing method for the display panel according to claim 11, the method comprising:

sequentially forming the plurality of pixel circuits, the light detection layer, and the plurality of light-emitting devices on a side of the base substrate, the plurality of pixel circuits and the plurality of light-emitting devices constituting the display structure layer; and sequentially bonding the polarizer, the first quarter-wave plate and the transparent cover plate on a side of the plurality of light-emitting devices facing away from the base substrate through adhesive materials; wherein the method further comprising:

forming the transparent insulating layer between the plurality of light-emitting devices and the light detection layer;

wherein before sequentially bonding the polarizer, the first quarter-wave plate and the transparent cover plate on the side of the plurality of light-emitting devices facing away from the base substrate through the adhesive materials, the method further comprises:

bonding the second quarter-wave plate on the side of the plurality of light-emitting devices facing away from the base substrate through another adhesive material.

14. The display panel according to claim 10, wherein an included angle between an optical axis of the first quarter-wave plate and a transmission axis of the polarizer is approximately 45 degrees; and an included angle between an optical axis of the second quarter-wave plate and a transmission axis of the polarizer is approximately 45 degrees.

15. The display panel according to claim 10, wherein each pixel circuit includes a plurality of thin film transistors, and each of the thin film transistors is a metal oxide thin film transistor.

16. The display panel according to claim 10, wherein the light detection layer includes at least one photoelectric detector, each photoelectric detector includes a photosensitive device and a thin film transistor connected to the photosensitive device, and the thin film transistor is an amorphous silicon thin film transistor;

wherein the photosensitive device includes a first electrode and a second electrode that are transparent, and a photoelectric conversion layer disposed between the first electrode and the second electrode, and the photoelectric conversion layer is configured to convert absorbed light into electricity; and the first electrode of the photosensitive device is connected to a common power line, the second electrode of the photosensitive device is connected to a source of the thin film transistor, a gate of the thin film transistor is connected to a gate line, and a drain of the thin film transistor is connected to a readout signal line.

17. A display apparatus, comprising the display panel according to claim 10.

* * * * *